United States Patent
Margetis et al.

(10) Patent No.: US 9,892,913 B2
(45) Date of Patent: Feb. 13, 2018

(54) RADIAL AND THICKNESS CONTROL VIA BIASED MULTI-PORT INJECTION SETTINGS

(71) Applicant: ASM IP Holding B.V., Almere (NL)

(72) Inventors: Joe Margetis, Gilbert, AZ (US); John Tolle, Gilbert, AZ (US); Gregory Bartlett, Phoenix, AZ (US); Nupur Bhargava, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/450,199

(22) Filed: Mar. 6, 2017

(65) Prior Publication Data

US 2017/0278707 A1 Sep. 28, 2017

Related U.S. Application Data

(60) Provisional application No. 62/312,951, filed on Mar. 24, 2016.

(51) Int. Cl.
*H01L 21/20* (2006.01)
*H01L 21/02* (2006.01)
*C23C 16/455* (2006.01)

(52) U.S. Cl.
CPC ...... *H01L 21/02636* (2013.01); *C23C 16/455* (2013.01); *H01L 21/02529* (2013.01); *H01L 21/02532* (2013.01); *H01L 21/02535* (2013.01); *H01L 21/02576* (2013.01); *H01L 21/02579* (2013.01)

(58) Field of Classification Search
CPC ......... H01L 21/02636; H01L 21/02529; H01L 21/02532; H01L 21/02535; H01L 21/02576; H01L 21/02579; C23C 16/455
See application file for complete search history.

(56) References Cited

U.S. PATENT DOCUMENTS

| | | | | |
|---|---|---|---|---|
| 2003/0017268 A1* | 1/2003 | Hu | ............ | C23C 16/34 427/255.391 |
| 2007/0056843 A1* | 3/2007 | Ye | ............ | C23C 14/3407 204/192.1 |
| 2007/0056850 A1* | 3/2007 | Ye | ............ | C23C 14/3407 204/298.12 |
| 2009/0197015 A1* | 8/2009 | Kudela | ............ | C23C 16/345 427/569 |
| 2015/0267299 A1* | 9/2015 | Hawkins | ............ | C23C 16/52 427/255.28 |
| 2016/0013022 A1* | 1/2016 | Ayoub | ............ | H01J 37/32091 427/569 |
| 2016/0362813 A1* | 12/2016 | Bao | ............ | C23C 16/45508 |
| 2017/0092469 A1* | 3/2017 | Kurita | ............ | C23C 16/458 |

* cited by examiner

*Primary Examiner* — Caleb Henry
(74) *Attorney, Agent, or Firm* — Snell & Wilmer LLP

(57) ABSTRACT

A gas distribution system is disclosed in order to obtain better film uniformity on a substrate in a cross-flow reactor. The better film uniformity may be achieved by an asymmetric bias on individual injection ports of the gas distribution system. The gas distribution may allow for varied tunability of the film properties.

17 Claims, 3 Drawing Sheets

RADIAL AND THICKNESS CONTROL VIA BIASED MULTI-PORT INJECTION SETTINGS

CROSS-REFERENCE TO RELATED APPLICATION

The present application claims priority to U.S. Provisional Patent Application No. 62/312,951, entitled "Radial and Thickness Control via Biased Multi-port Injection Settings" and filed on Mar. 24, 2016, the contents of which are hereby incorporated herein by reference to the extent such contents do not conflict with the present disclosure.

FIELD OF INVENTION

The invention relates to a reaction system for processing semiconductor substrates. Specifically, the invention relates to biasing a gas distribution apparatus that results in improved film uniformity for substrates in the reaction system.

BACKGROUND OF THE DISCLOSURE

In a cross-flow reaction system, deposition of a film may occur when gases flow across a surface of the substrate. These deposition processes may result in a greater deposition of film in a center of a substrate in comparison to an edge of the substrate. In addition, it may be possible that a chemical composition of a film may differ in the center of the substrate compared to the edge of the substrate.

An uneven distribution of a deposited film's thickness and chemical composition may prove to be problematic in the processing of semiconductor substrates. The layer may have within wafer device issues due to non-uniform film thickness and composition, causing unevenness in device performance (such as mobility, etc.) on the same substrate.

As a result, a need exists for a system that distributes gas in a manner that improves film uniformity.

SUMMARY OF THE DISCLOSURE

A method for performing an asymmetric biasing of precursor gas injection is disclosed. The method comprises: providing a reaction chamber, the reaction chamber holding a substrate to be processed; providing a first multiple port injector assembly, the first multiple port injector assembly comprising a first plurality of individual port injectors for providing a first gas from a first gas source to the substrate; providing a second multiple port injector assembly, the second multiple port injector assembly comprising a second plurality of individual port injectors for providing a second gas from a second gas source to the substrate; flowing the first gas onto the substrate with the first multiple port injector assembly, wherein the first multiple port injector assembly has an asymmetric or symmetric bias of the first plurality of individual port injectors; and flowing the second gas onto the substrate with the second multiple port injector assembly, wherein the second multiple port injector assembly has an asymmetric or symmetric bias of the second plurality of individual port injectors; wherein a substantially uniform distribution of the first gas and the second gas across the substrate is achieved; and wherein a reaction takes place between the first gas and the second gas on the substrate to form a first film.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Embodiments of the invention are directed to creating a more uniform film on a substrate in a cross-flow reactor. Issues of uniformity between a center and an edge of a substrate are common in deposition of multi-component group IV epitaxial layers, such as Si:P, SiC:P, Si:B, SiGe:C, SiGe:P, Ge:P, Ge:B, GeSn, GeSn:B, GeSn:P, and SiGeSn, for example. Embodiments of the invention are directed to formation of these multi-component group IV epitaxial layers, and are just as applicable to elemental films (such as Si, Ge, Ga, and As), binary films (such as $Si_{1-x}$, SiGe, GeSn, SiSn), ternary films (such as SiGeC and SiGeSn), and quaternary films (such as SiGeSnC and SiGeCP). These films may be either doped (p-type or n-type) or undoped (such as undoped SiGe, for example). Embodiments of the invention are directed to creating a uniform thickness of the film, as well as a uniform chemical concentration across the substrate. Embodiments of the invention may be directed to processes that are selective or non-selective. Selective processes may comprise a selective epitaxial growth (SEG) process, a co-flow process, or a cyclic deposition and etching (CDE) process.

Figure 1:
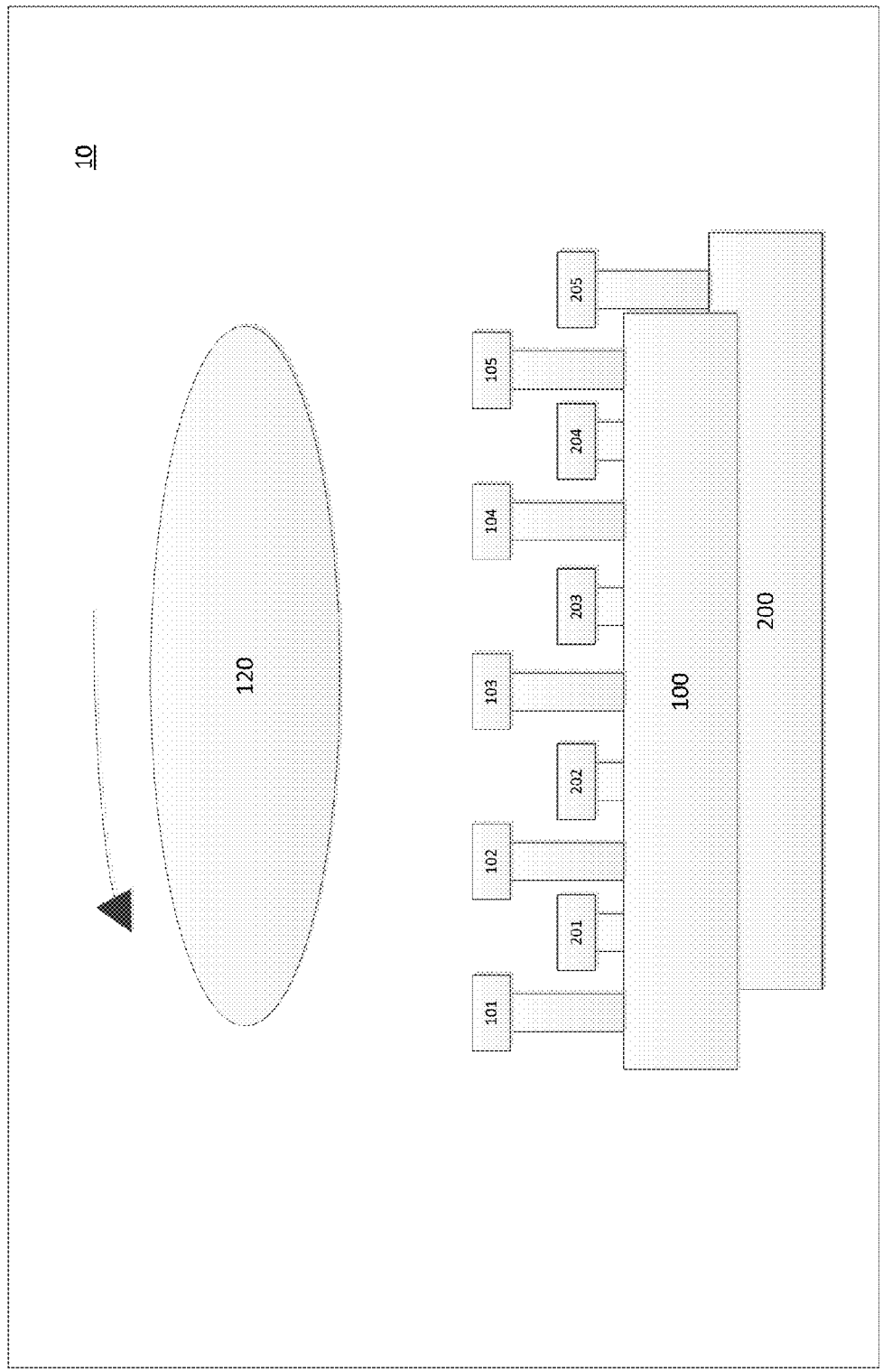
FIG. 1 illustrates a gas injection system in accordance with at least one embodiment of the invention.

FIG. 1 illustrates a reaction system 10 in accordance with at least one embodiment of the invention. The reaction system 10 may be an epitaxy deposition tool, such as the Intrepid from ASM International N.V. An example of the reaction system 10 may be disclosed in U.S. patent application Ser. No. 14/218,690, assigned to ASM IP Holding B.V., which is incorporated herein by reference.

The reaction system 10 may comprise a first multi-port injector (WI) 100 and a second multi-port injector (MPI) 200. The first MPI 100 may comprise a first plurality of individual injection ports 101-105, while a second MPI 200 may comprise a second plurality of individual injector ports 201-205. The individual injector ports 101-105 and the individual injector ports 201-205 may comprise a BMW series metering valve manufactured by Swagelok® and a brushless DC motor manufactured by HanBay Inc., for example. In addition, injector ports may be controlled by mass flow controllers (NIFCs) manufactured by Horiba or MKS Instruments. The first MPI 100 and the second MPI 200 may be disposed in a close spatial relationship or separated spatially. The first MPI 100 and the second MPI 200 are not limited to five individual injector ports and may have more or less than five individual injector ports depending on the application. For example, the number of individual injector ports may range from 1 to 15, from 3 to 10, or from 5 to 8 depending on the application.

Within the reaction system 10, a substrate 120 may be rotating in either a counterclockwise (as pictured) or in a clockwise manner. The clockwise or counterclockwise rotation may take place at a rate of 5 rpm to 120 rpm, or preferably between 10 rpm and 40 rpm. The rate of rotation is not limited to the ranges below and may exceed 120 rpm or be below 5 rpm. An additional MPI and individual injector ports may be disposed within the same reaction chamber in order to allow injection of a second gas onto the substrate 120.

For the formation of multi-component group IV epitaxial layers, such may require flow of multiple gases. Flow of a first gas may be a silicon source, such as dichlorosilane (DCS), silane ($SiH_4$), disilane ($Si_2H_6$), trisilane ($Si_3H_8$), or trichlorosilane (TCS). Flow of a second gas may be a dopant or alloy precursor gas, for example. An example of a dopant or alloy precursor gas may comprise at least one of: phosphine ($PH_3$), germane ($GeH_4$), digermane ($Ge_2H_6$), diborane ($B_2H_6$), methane ($CH_4$), tin chloride ($SnCl_4$), arsine ($AsH_3$), or mono-methylsilane (MMS). The dopant or alloy precursor gas may comprise either n-type or p-type dopants. In addition, HCl, chlorine ($Cl_2$), hydrogen ($H_2$), or nitrogen ($N_2$) may be added to either the first gas or the second gas for selectivity and dilution purposes. A third gas maybe used for etching in CDE processes. The third gas may be HCl or chlorine ($Cl_2$). Gas flows may be symmetric or asymmetric depending on the desired process tunability.

In order to avoid the center-to-edge uniformity issues, at least one embodiment of the invention may relate to an asymmetric biasing of the individual injector ports 101-105. An asymmetric biasing of the individual injector ports may involve allowing different flow rates for the individual injector ports 101-105. For example, the individual injector ports 101-102 may be configured to allow flow of a dopant gas, while the other individual injector ports 103-105 may be configured to flow no gas at all. The flow of gas through the individual injector ports 101-105 can be varied by a number of turns on a valve for the individual injector ports 101-105. In addition, injector ports may be controlled by mass flow controllers (MFCs) manufactured by, for example, Horiba or MKS Instruments.

A software program may be configured to control the flow through the individual injector ports 101-105. The software program may dictate how long the individual injector ports 101-105 are open as well as the extent to which the individual injector ports 101-105 are open.

In accordance with at least one embodiment of the invention, a doped film (such as a Si:P film) may be formed. To do so, the first MPI 100 may flow dichlorosilane (DCS) onto a substrate. The flow may take place at a reactor pressure ranging between 1 torr and 760 torr, preferably between 100 torr and 500 torr. The flow may take place at a reactor temperature ranging between 250° C. and 1100° C., preferably between 350° C. and 800° C. The flow may have a duration that depends on a desired thickness, growth rate, and film thickness. In accordance with at least one embodiment, an asymmetric biasing of the individual injector ports may take place such that individual injector ports 101-102 may flow the DCS, while the other individual injector ports 103-105 do not flow any DCS. In accordance with at least one embodiment, an asymmetric biasing of the individual injector ports may result such that individual injector ports 101, 102, and 105 do not flow gas, while individual injector ports 103 and 104 flow gas, or such that individual injector ports 101 and 105 do not flow gas, while individual injector ports 102, 103, and 104 flow gas.

The second MPI 200 then may flow phosphine onto the substrate. The flow may take place at a reactor pressure ranging between 1 torr and 760 torr, preferably between 100 torr and 500 torr. The flow may take place at a reactor temperature ranging between 250° C. and 1100° C., preferably between 350° C. and 800° C. The flow may have a duration that depends on a desired thickness, growth rate, and film thickness. In accordance with at least one embodiment, an asymmetric biasing of the individual injector ports may take place such that individual injector ports 201-202 may flow the phosphine, while the other individual injector ports 203-205 do not flow any phosphine. In accordance with at least one embodiment, an asymmetric biasing of the individual injector ports may result such that individual injector ports 201, 202, and 205 do not flow gas, while individual injector ports 203 and 204 flow gas, or such that individual injector ports 201 and 205 do not flow gas, while individual injector ports 202, 203, and 204 flow gas.

Figure 2:
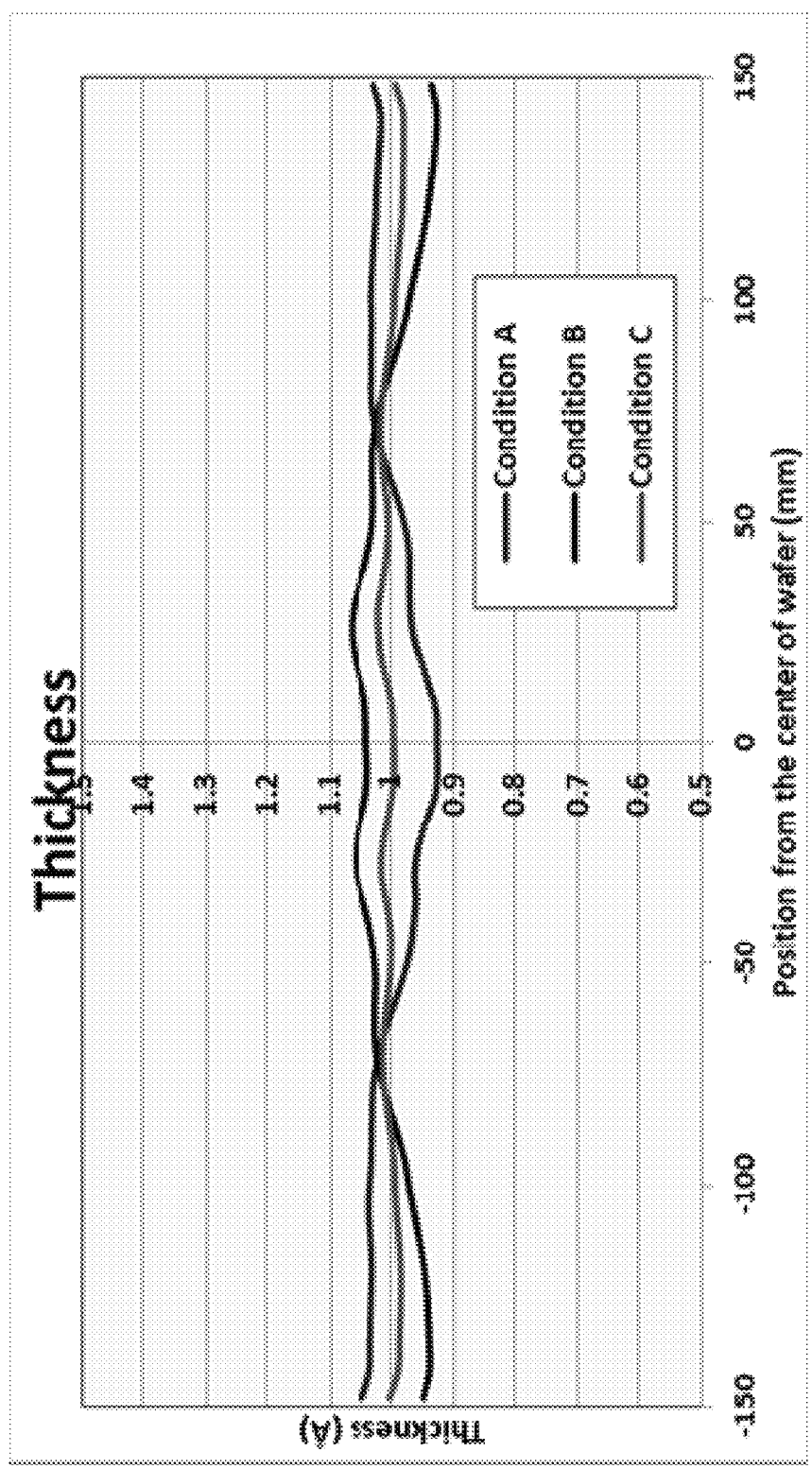
FIG. 2 illustrates a graph of thickness in accordance with at least one embodiment of the invention.

The asymmetric biasing may indicate a more uniform distribution of phosphine applied to the substrate. The asymmetric biasing may allow for an improved tunability to the process, thus allowing for versatility in the films deposited. FIG. 2 illustrates a set of results illustrating thickness as a function of position from a center of the wafer using asymmetric flow configurations. Different lines on the graph represent different asymmetric conditions. The asymmetric biasing may lead to a thickness profile to be tuned from a frown profile (as seen in Condition B) to a smile profile (as seen in Condition A), thus providing a wide range of tunability for thickness.

Figure 3:
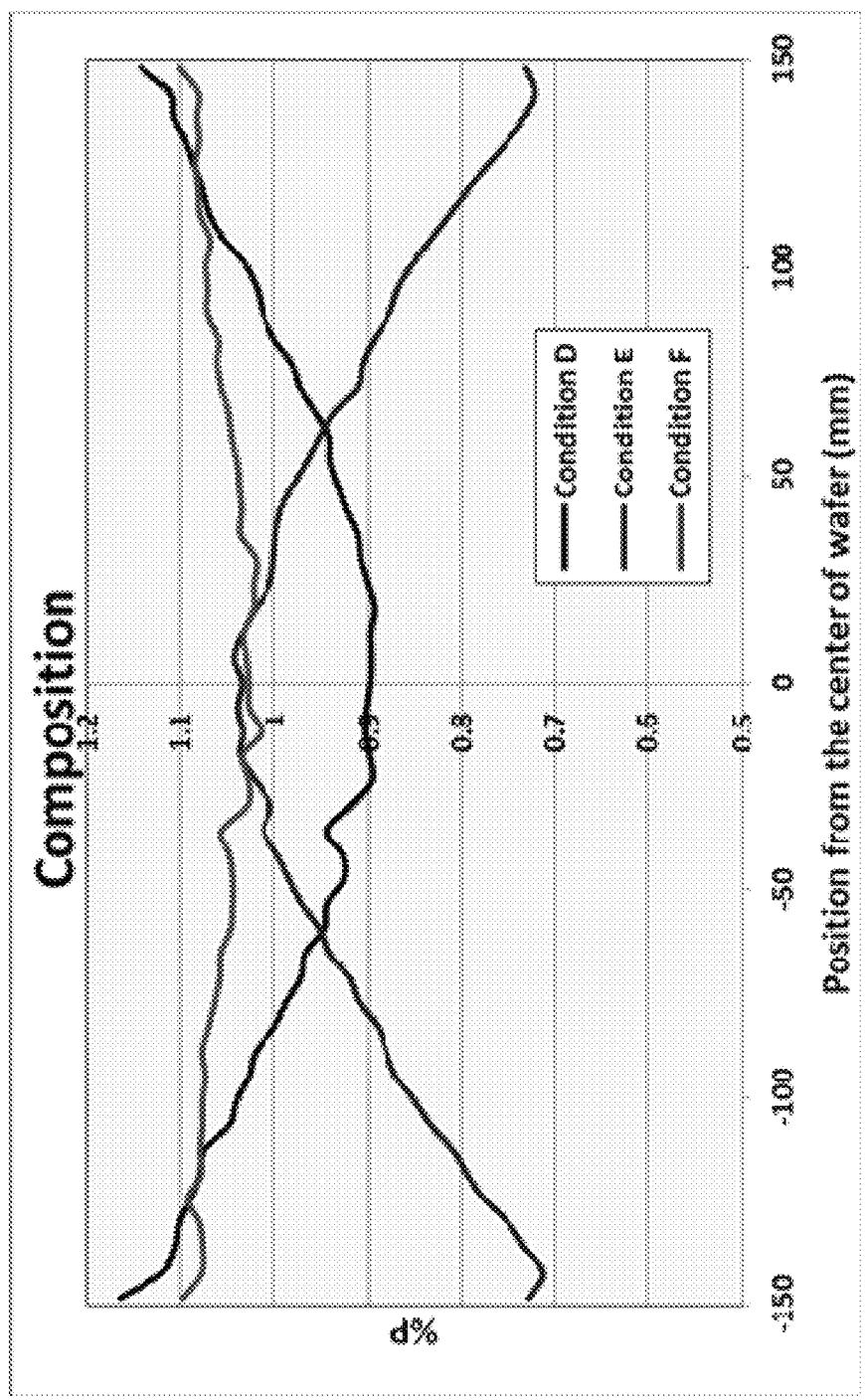
FIG. 3 illustrates a graph of composition in accordance with at least one embodiment of the invention.

FIG. 3 illustrates a set of results illustrating composition as a function of position from a center of the wafer using asymmetric flow configurations. Similar to FIG. 2, different lines on the graph represent different asymmetric conditions. The asymmetric biasing may lead to a phosphorus composition profile to be tuned from a frown profile (as seen in Condition E) to a smile profile (as seen in Conditions D and F), thus providing a wide range of tunability for concentration.

In accordance with at least one embodiment of the invention, the reaction system 10 may be used to form multi-layer film stacks, which may comprise alternating layers of silicon (Si) and silicon germanium (SiGe). These films may be undoped.

In accordance with at least one embodiment of the invention, the reaction system may also be used in CDE. In such an arrangement, a process may comprise of alternating deposition and etching steps. In etching step, chlorine ($Cl_2$) gas may be flowed. The flow may take place at a reactor pressure ranging between 1 torr and 760 torr, preferably between 10 torr and 200 torr. The flow may take place at a reactor temperature ranging between 250° C. and 1100° C., preferably between 350° C. and 800° C.

A biasing of the individual injector ports may be arranged as needed. In accordance with one embodiment of the invention, an asymmetric biasing of the individual injector ports may take place such that individual injector ports 201-202 flow chlorine, while the other individual injector ports 203-205 do not flow chlorine. In accordance with at least one embodiment, an asymmetric biasing of the individual injector ports may result such that individual injector ports 201, 202, and 205 do not flow gas, while individual injector ports 203 and 204 flow gas. In another embodiment, a biasing may take place such that individual injector ports 201 and 205 do not flow gas, while individual injector ports 202, 203, and 204 flow gas. The deposition and etching may be repeated several cycles ranging between 0 cycle to 100 cycles, preferably between 0 and 50 cycles.

In order to form these film stacks, the first MPI 100 may be configured to flow a silicon source (such as dichlorosilane (DCS) or silane) and hydrochloric acid (HCl). The flow may take place at a reactor pressure ranging between 1 torr and 200 torr, preferably between 5 torr and 60 torr. The flow may take place at a reactor temperature ranging between 200° C. and 1000° C., preferably between 300° C. and 900° C. The flow may have a duration that depends on a desired composition and thickness of the layer.

An asymmetric biasing of the individual injector ports may take place such that individual injector ports 101-102 may flow the DCS, while the other individual injector ports 103-105 do not flow any DCS. Other asymmetric biasing conditions may be possible depending on a desired profile. The first multi-port injector 100 may also be connected to a source of HCl. The individual injector ports 101-105 may be configured such that particular injector ports may flow DCS, while others flow HCl.

The second MPI 200 may be configured to flow a germanium source, such as germane ($GeH_4$) or digermane. The flow may take place at a reactor pressure ranging between 1 torr and 200 torr, preferably between 5 torr and 60 torr. The flow may take place at a reactor temperature ranging between 200° C. and 1000° C., preferably between 300° C. and 900° C. The flow may have a duration that depends on a desired composition and thickness of the layer. An asymmetric biasing of the individual injector ports may take place such that individual injector ports 201-202 may flow the $GeH_4$, while the other individual injector ports 203-205 do not flow any $GeH_4$. Other asymmetric biasing conditions may be possible depending on a desired profile.

In accordance with at least one embodiment of the invention, the reaction system 10 may be used to form multi-layer film stacks, which may comprise alternating layers of germanium (Ge) and germanium tin (GeSn). These film stacks may be used in applications such as stressors for logic devices.

In order to form these film stacks, the first MPI 100 may be configured to flow a tin source (such as tin chloride ($SnCl_4$) or tin hydride) and hydrochloric acid (HCl). The flow may take place at a reactor pressure ranging between 1 torr and 760 torr, preferably between 500 torr and 760 torr. The flow may take place at a reactor temperature ranging between 100° C. and 800° C., preferably between 150° C. and 500° C. The flow duration depends on the desired composition and thickness of the layer. An asymmetric biasing of the individual injector ports may take place such that individual injector ports 101-102 may flow the tin chloride, while the other individual injector ports 103-105 do not flow any tin chloride. The first multi-port injector 100 may also be connected to a source of HCl. The individual injector ports 101-105 may be configured such that particular injector ports may flow tin chloride, while others flow HCl.

The second MPI 200 may be configured to flow a germanium source (such as germane ($GeH_4$) or digermane). The flow may take place at a reactor pressure ranging between 1 torr and 760 torr, preferably between 500 torr and 760 torr. The flow may take place at a reactor temperature ranging between 100° C. and 800° C., preferably between 150° C. and 500° C. The flow duration depends on the desired composition and thickness of the layer. An asymmetric biasing of the individual injector ports may take place such that individual injector ports 201-202 may flow the germane, while the other individual injector ports 203-205 do not flow any germane.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A process for forming a uniform film on a substrate, comprising:
   providing a reaction chamber, the reaction chamber holding a substrate to be processed;
   providing a first multiple port injector assembly, the first multiple port injector assembly comprising a first plurality of individual port injectors for providing a first gas from a first gas source to the substrate;
   providing a second multiple port injector assembly, the second multiple port injector assembly comprising a second plurality of individual port injectors for providing a second gas from a second gas source to the substrate;
   flowing the first gas onto the substrate with the first multiple port injector assembly, wherein the first multiple port injector assembly has an asymmetric bias of the first plurality of individual port injectors; and
   flowing the second gas onto the substrate with the second multiple port injector assembly, wherein the second multiple port injector assembly has an asymmetric bias of the second plurality of individual port injectors;

wherein a substantially uniform distribution of the first gas and the second gas across the substrate is achieved; and wherein a reaction takes place between the first gas and the second gas on the substrate to form a first film.

2. The process of claim 1, wherein the first gas comprises at least one of: dichlorosilane (DCS); silane ($SiH_4$); disilane ($Si_2H_6$); trisilane ($Si_3H_8$); trichlorosilane (TCS); hydrochloric acid (HCl); hydrogen ($H_2$); or nitrogen ($N_2$).

3. The process of claim 1, wherein the second gas comprises at least one of: phosphine ($PH_3$); germane ($GeH_4$); digermane ($Ge_2H_6$); diborane ($B_2H_6$); $CH_4$; monomethylsilane (MMS); tin chloride ($SnCl_4$); tin hydride; hydrochloric acid (HCl); chlorine ($Cl_2$); hydrogen ($H_2$); or nitrogen ($N_2$).

4. The process of claim 1, wherein the reaction chamber performs a selective process on the substrate.

5. The process of claim 4, wherein the selective process comprises a cyclic deposition and etching (CDE) process.

6. The process of claim 4, wherein the selective process comprises a co-flow of the first gas and the second gas.

7. The process of claim 4, wherein the selective process comprises a selective epitaxial growth (SEG) process.

8. The process of claim 1, wherein the reaction chamber performs a non-selective process on the substrate.

9. The process of claim 1, wherein a pressure of the reaction chamber ranges between 1 torr and 760 torr, or between 500 torr and 760 torr.

10. The process of claim 1, wherein a temperature of the reaction chamber ranges between 100° C. and 800° C., or between 150° C. and 500° C.

11. The process of claim 1, wherein the asymmetric bias of the first plurality of individual port injectors comprises a first number of individual port injectors flowing the first gas and a second number of individual port injectors not flowing the first gas.

12. The process of claim 1, wherein the asymmetric bias of the second plurality of individual port injectors comprises a third number of individual port injectors flowing the second gas and a fourth number of individual port injectors not flowing the second gas.

13. A process for forming a uniform film on a substrate, comprising:

providing a reaction chamber, the reaction chamber holding a substrate to be processed;

providing a first multiple port injector assembly, the first multiple port injector assembly comprising a first plurality of individual port injectors for providing a first gas from a first gas source to the substrate;

providing a second multiple port injector assembly, the second multiple port injector assembly comprising a second plurality of individual port injectors for providing a second gas from a second gas source to the substrate;

flowing the first gas onto the substrate with the first multiple port injector assembly, wherein the first multiple port injector assembly has an asymmetric bias of the first plurality of individual port injectors; and flowing the second gas onto the substrate with the second multiple port injector assembly, wherein the second multiple port injector assembly has a symmetric bias of the second plurality of individual port injectors;

wherein a substantially uniform distribution of the first gas and the second gas across the substrate is achieved; and wherein a reaction takes place between the first gas and the second gas on the substrate to form a first film.

14. The process of claim 13, wherein the asymmetric bias of the first plurality of individual port injectors comprises a first number of individual port injectors flowing the first gas and a second number of individual port injectors not flowing the first gas.

15. A reaction system configured to form a uniform film on a substrate, comprising:

a reaction chamber configured to hold a substrate to be processed;

a first multiple port injector assembly, the first multiple port injector assembly comprising a first plurality of individual port injectors for providing a first gas from a first gas source to the substrate, wherein the first multiple port injector assembly has an asymmetric bias of the first plurality of individual port injectors; and a second multiple port injector assembly, the second multiple port injector assembly comprising a second plurality of individual port injectors for providing a second gas from a second gas source to the substrate, wherein the second multiple port injector assembly has an asymmetric bias of the second plurality of individual port injectors;

wherein a substantially uniform distribution of the first gas and the second gas across the substrate is achieved; and wherein a reaction takes place between the first gas and the second gas on the substrate to form a first film.

16. The reaction system of claim 15, wherein the asymmetric bias of the first plurality of individual port injectors comprises a first number of individual port injectors flowing the first gas and a second number of individual port injectors not flowing the first gas.

17. The reaction system of claim 15, wherein the asymmetric bias of the second plurality of individual port injectors comprises a third number of individual port injectors flowing the second gas and a fourth number of individual port injectors not flowing the second gas.

* * * * *